United States Patent
Cross et al.

(10) Patent No.: US 10,222,419 B2
(45) Date of Patent: Mar. 5, 2019

(54) METHOD, SYSTEM AND APPARATUS FOR TUNING AN INTEGRATED EMBEDDED SUBSYSTEM

(71) Applicant: ARM Limited, Cambridge (GB)

(72) Inventors: Daniel Lewis Cross, Boca Raton, FL (US); Brian Alan Nagel, Boynton Beach, FL (US)

(73) Assignee: Arm Limited, Cambridge (GB)

( * ) Notice: Subject to any disclaimer, the term of this patent is extended or adjusted under 35 U.S.C. 154(b) by 31 days.

(21) Appl. No.: 15/385,971

(22) Filed: Dec. 21, 2016

(65) Prior Publication Data

US 2018/0172764 A1 Jun. 21, 2018

(51) Int. Cl.
*G01R 31/3177* (2006.01)
*G01R 31/317* (2006.01)

(52) U.S. Cl.
CPC ... *G01R 31/3177* (2013.01); *G01R 31/31713* (2013.01); *G01R 31/31724* (2013.01)

(58) Field of Classification Search
CPC .......... G01R 31/3177; G01R 31/31724; G01R 31/31713; G01R 31/318555
See application file for complete search history.

(56) References Cited

U.S. PATENT DOCUMENTS

| 7,529,996 B2 * | 5/2009 | Whetsel | G01R 31/31855 714/729 |
| 2008/0010569 A1 * | 1/2008 | Whetsel | G01R 31/31855 714/724 |

* cited by examiner

*Primary Examiner* — Shelly A Chase
(74) *Attorney, Agent, or Firm* — Leveque Intellectual Property Law, P.C.

(57) ABSTRACT

A method, apparatus and system are provided for the tuning of embedded subsystems of a device under test (DUT) that have analog characteristics. In response to a tester invoking one or more test procedures via a command channel between the tester and a target embedded subsystem of the DUT, test firmware of the invoked tests is loaded into the target embedded subsystem. The target embedded subsystem executes the tests under control of the tester in accordance with test parameters received from the tester over the command channel and in accordance with test commands received from the tester over a test signaling channel. The target embedded subsystem returns results of the one or more tests to the tester via the command channel. The results can be used to trim analog characteristics of the target embedded subsystem and can be stored in memory. The test firmware can then be deleted to free up memory space.

24 Claims, 7 Drawing Sheets

METHOD, SYSTEM AND APPARATUS FOR TUNING AN INTEGRATED EMBEDDED SUBSYSTEM

BACKGROUND

Embedded subsystems that provide dedicated functionality within a larger electrical system or circuit often must be tested and tuned. Embedded subsystems may contain digital, analog, mixed-signal and radio frequency (RF) circuits that need to be tuned to improve performance. While standard digital circuits and memory of embedded subsystems can be tested using standard scan test methods and built-in self-test (BIST), analog, mixed signal, RF and other embedded subsystem circuitry having analog performance parameters are not readily tested and tuned.

Problematic to the proper testing and tuning of embedded subsystems having analog performance parameters is the lack of a direct interface between an embedded subsystem and external test equipment, and more particularly between test equipment that is external to a Device Under Test (DUT) having one or more embedded subsystems. Moreover, there is a need to be able to readily perform internal production testing and calibration within an embedded subsystem.

DETAILED DESCRIPTION OF THE EMBODIMENTS

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth.

All documents mentioned herein are hereby incorporated by reference in their entirety. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," "substantially," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus and device may be used interchangeably in this text.

The various embodiments and examples of the present disclosure as presented herein are understood to be illustrative of the present disclosure and not restrictive thereof and are non-limiting with respect to the scope of the present disclosure.

Further particular and preferred aspects of the present disclosure are set out in the accompanying independent and dependent claims. Features of the dependent claims may be combined with features of the independent claims as appropriate, and in combinations other than those explicitly set out in the claims.

The present disclosure relates to tuning and testing of embedded subsystems within a Device Under Test (DUT). A tuning system has a tester in communication with a DUT that has a host embedded subsystem and a target embedded subsystem to be tuned within the DUT. The use of a controller of the target embedded subsystem, such as a microcontroller unit (MCU) or other resources, if available, facilitates tuning of the target embedded subsystem. While the target embedded subsystem may contain standard digital circuits and memory that can be tested using standard scan test methods and built-in self-test (BIST), there are other circuitry and/or functionality of the target embedded subsystem having analog performance parameters that must be measured and optimized (trimmed). Test results are trim values returned by the target embedded subsystem via a command channel and can be stored in a local nonvolatile memory and the results of the tests later retrieved from memory and used to trim one or more structures of the target embedded subsystem. The trim results may be stored in nonvolatile memory of the tester and/or local, nonvolatile memory of the target embedded subsystem, for example. Alternately, the target embedded subsystem could remember the test results, thereby obviating the need to store the returned test results in nonvolatile memory of the tester or the target embedded subsystem.

The target embedded subsystem refers to the part or functionality of a DUT that is to be tested and/or tuned. The target embedded subsystem may comprise analogic-centric functionality that must be tested and tuned in order to measure and then optimize analog performance parameters. A target embedded subsystem may be implemented as a System-on-Chip (SoC), an integrated circuit having various digital, analog, mixed signal and Radio Frequency (RF) functions all on a single chip substrate. By way of example and not limitation, a target embedded subsystem may be a radio, e.g. a low power radio, a cellphone radio, a TV tuner that receives analogic signals over the air; an analog sensor that measures temperature and pressure; and a medical subsystem, such as a System-on-Chip (SoC), that tests biological samples. In light of this, while a low power radio is described as an example target embedded subsystem, the disclosure of potential target embedded subsystems is not to be so limited.

Figure 1:
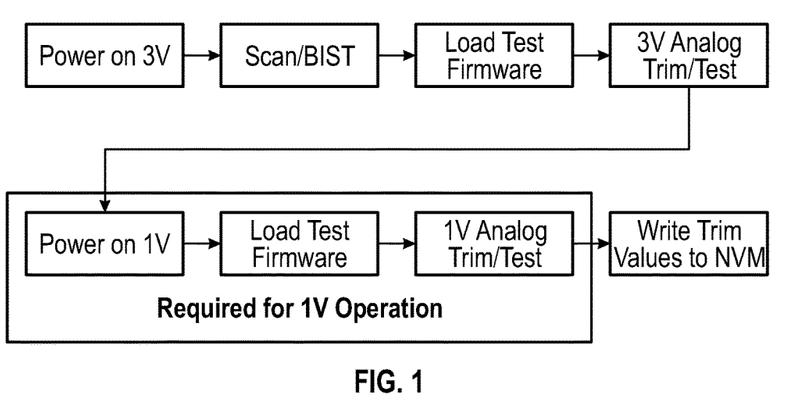
FIG. 1 is a high-level outline of a method for tuning and testing an example radio target embedded subsystem, in accordance with embodiments of the disclosure.

Referring to FIG. 1, a high-level outline of a procedure for tuning and testing a target embedded subsystem in a plurality of environments is shown. In this example, the target embedded subsystem is a low power radio that has 1V and 3V operating configurations that can be configured at test time. The target embedded subsystem is not limited to radios. In this example, the radio is first tested for 3V operation and then for 1V operation. Further, there may be test firmware associated with various other types of operational testing of a target embedded subsystem.

Figure 2:
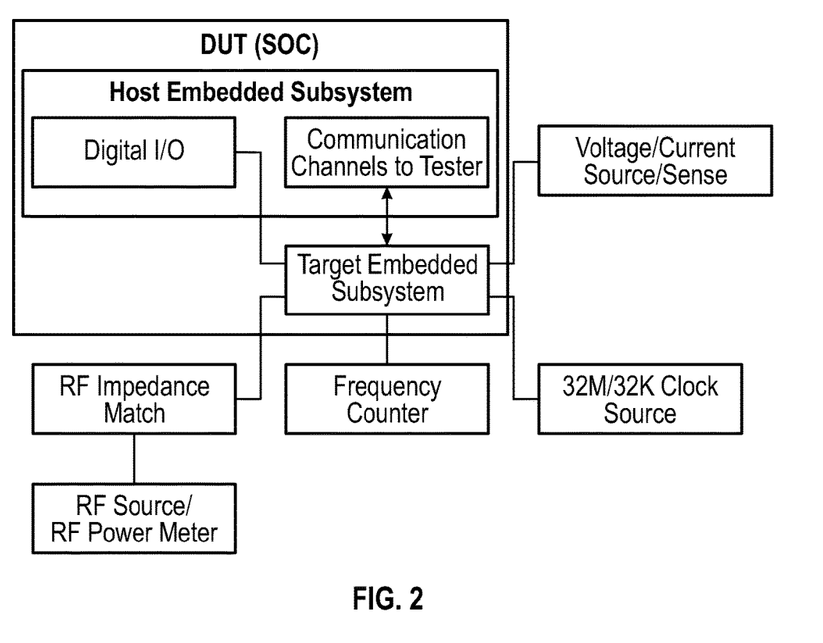
FIG. 2 is a block diagram of a testing system for testing and tuning of an example radio target embedded subsystem, in accordance with embodiments of the disclosure.

Continuing with the test system example, in FIG. 2 a block diagram shows various components of a test system having a DUT with host and target embedded subsystems of the SoC and tester resources used for testing and tuning. A host embedded subsystem of the DUT has communication channels and digital input/output (I/O) in order to facilitate communication between the tester and the target embedded subsystem. Test resources can include but are not limited to: radio frequency (RF) impedance match; voltage/Current source and sensing; the clock source; the frequency counter; and RF power source. In this example, in order to test and tune the radio target embedded subsystem, several types of analog test resources must connect directly and dynamically to the pins or pads of the radio. RF resources must connect via an impedance transforming network (shown as RF impedance match). Digital I/O and communication channels must have dynamic paths through other SOC resources to internal pins of the radio.

A tester must coordinate configuration of the radio target embedded subsystem into various test modes via several communication channels with application of the test resources to measure the radio operating parameters. Thus, for purposes of illustration, the various functional blocks of the representative radio target embedded subsystem shown in the block diagram 100 of FIG. 3, may be tested and tuned; as will be described, various blocks of the radio having to do with the analog functions, such as blocks 110, 120, 130, 140, 150, 160, 170, 180, and 190, may be tested and tuned. Each set of tests has a specific and somewhat unique testing procedure for the radio, some of which will be described below, but generally each test has an invocation sequence or command, then makes a series of measurements of the radio that are triggered or sequenced by communication signals passed between the radio and the tester, via intermediate SOC resources, such as the host embedded subsystem of the DUT, followed by a post-test sequence or communication. This is graphically represented in the functional flow of FIG. 4.

In accordance with certain embodiments described herein, the target embedded subsystem of the DUT may have no direct communication link or other connection to the tester, so that communications between the target embedded subsystem and the tester are managed via the host embedded subsystem of the DUT. The DUT SoC may contain a host controller interface (HCI), shown as 195 of FIG. 3, which carries communications between the host embedded subsystem and the target embedded subsystem. Target embedded subsystem test firmware may not be part of the regular operating firmware due to memory size or other limitations. Therefore, the firmware that implements the test commands for the target embedded subsystem are loaded at test time, and this may be done using a firmware patch procedure. Thus, as an example, responsive to receiving the command by the tester to invoke the one or more tests, test firmware of the invoked one or more tests may be loaded into local memory, such as unallocated memory (patch space), of a microcontroller of the target embedded subsystem by the host embedded subsystem via a host controller interface between the host embedded subsystem and the target embedded subsystem. Where the host controller interface is a system channel between the target and host embedded subsystems, the host embedded subsystem can transmit to the target embedded subsystem via the system channel a firmware load command that describes the size and type of the test firmware of the invoked one or more tests and then iteratively load firmware data of the test firmware onto the microcontroller of the target embedded subsystem with one or more firmware data commands.

Test command binaries may be encapsulated into host test firmware. As used herein, test command binaries refer to pre-compiled test firmware in a binary format. Sample Host code may include guidelines for implementing the interface between the DUT and the tester, which must be part of the Host firmware. Thus the test firmware stored in the host embedded subsystem includes test commands that define a first interface between the host embedded subsystem and the tester, and a second interface between the host and the target embedded subsystem. Following execution of the invoked one or more tests, the test firmware of the invoked tests can be deleted from both the target embedded subsystem and the host embedded subsystem. In accordance with alternate embodiments, test command binaries may reside on the tester and be loaded to the target embedded subsystem via the host embedded subsystem at test time.

To coordinate testing of the target embedded subsystem, the host embedded subsystem is loaded with test-specific firmware. Assuming that the host embedded subsystem scan and BIST take place concurrently with the scan and BIST of the target embedded subsystem, test-specific firmware can be loaded after these scan and BIST operations. Thus, the test firmware can be loaded during a host scan and/or a BIST of the host embedded subsystem.

Referring now to the system block diagram of FIG. 5, a process for loading firmware at test time to test the target embedded subsystem will be described. The DUT 10 has both target and host embedded subsystems that can communicate via a system channel 25, which can be an asynchronous communication channel, for example. There are various communication channels between the tester and the host embedded subsystems, and the host embedded subsystem 30 facilitates communication between the tester 60 and the target embedded subsystem 20 so that tuning of targeted portions of the target embedded subsystem, in accordance with loaded firmware, is accomplished. In this way, firmware test binaries 40 that perform or facilitate tuning are loaded into the target embedded subsystem's controller, such as MCU, at test time and may be subsequently deleted to recover memory space. Additionally, the host embedded subsystem firmware that implements various communication channels to and from the Tester is not needed after test and can also be deleted. Alternate embodiments can have the firmware as a permanent part of the target and/or host embedded subsystem(s).

Figure 6:
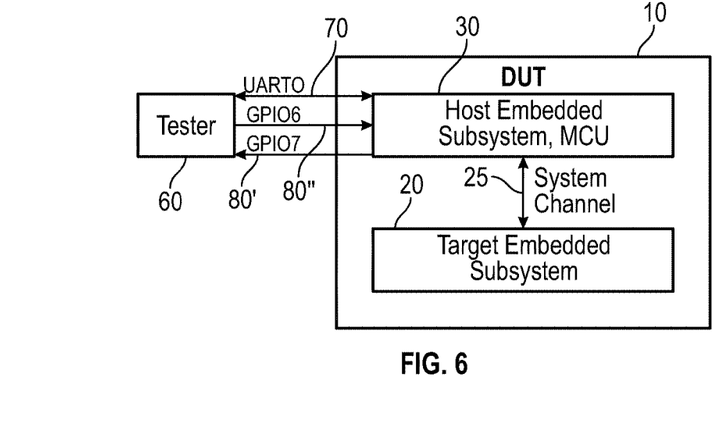
Figure 7:
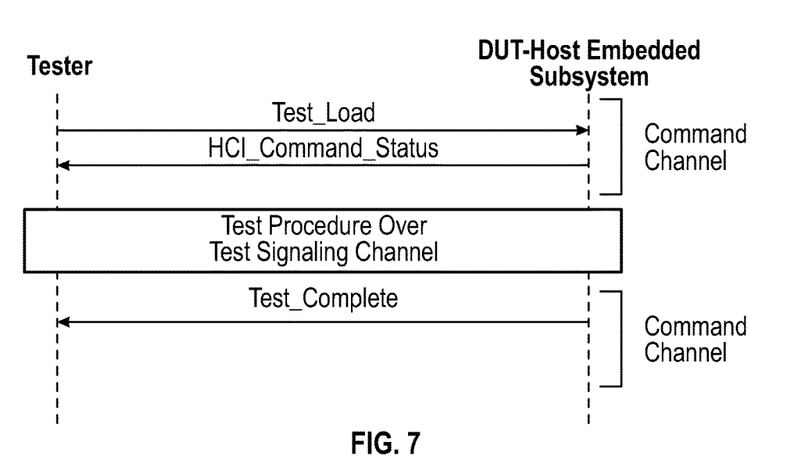
FIGS. 7, 8 and 9 are sequence diagrams that illustrate various portions of the test and tuning methodology, in accordance with embodiments of the disclosure.
Figure 8:
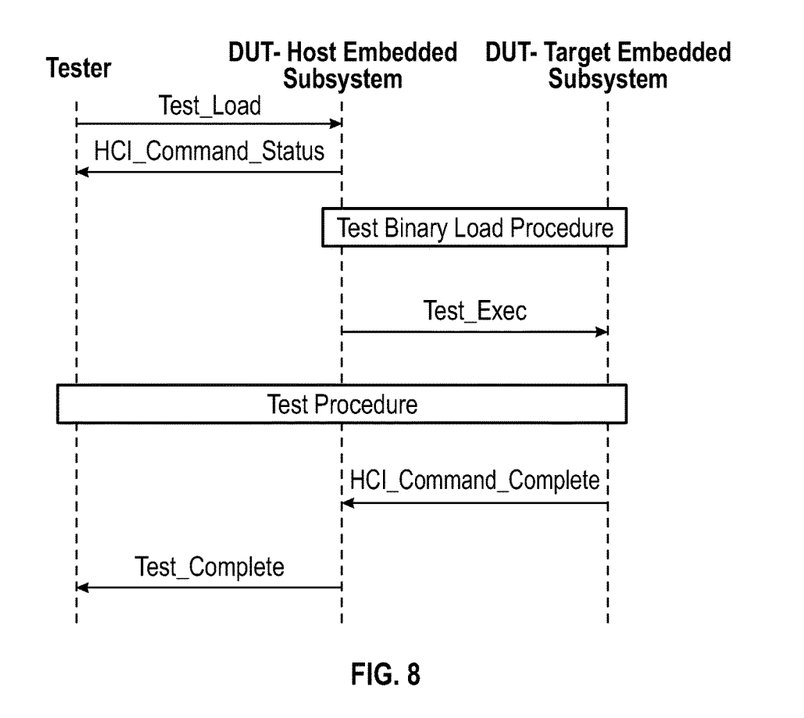

In accordance with certain embodiments of the disclosure, as shown in FIG. 6 there are at least two logical communication channels between the tester 60 and the target embedded subsystem 20, which may be facilitated via the host embedded subsystem 30. The command channel and the test signaling channel are channels 70, 80 for controlling test flow and are implemented in test firmware that may be loaded at test time or may be a permanent part of the operating firmware. The test firmware of invoked tests control operation of the command and test signaling channels during execution of the invoked tests. The command channel is a bidirectional channel that extends logically between the tester and the target embedded subsystem over which the following actions occur: i) the tester invokes a particular test; ii) the tester passes test parameters to the target embedded subsystem; and iii) the target embedded subsystem returns test results to the tester. Command input parameters and return parameters are associated with each test. Input and output parameters bytes are processed and transmitted in accordance with the firmware test binaries 40, and may be processed and transmitted in Little Endian order, for example.

The test signaling channel is a channel that extends logically between the Tester and the target embedded subsystem. Each test advances based on communication between the target embedded subsystem and the tester via a test signaling channel. This test signaling channel consists of the test signal output from target embedded subsystem, via the host embedded subsystem, to the tester; and the tester test signal output from the tester, via the host embedded subsystem, to the target embedded subsystem. In the block diagram of FIG. 5, a host controller interface (HCI) 50 passes the signals between the tester 60 and the system channel 25.

In the direction from the tester to the target embedded subsystem, the test signaling channel may be a limited signal with two values, "continue" and "stop". In the direction from the target embedded subsystem to the tester, the test signaling channel may have more limited information, such as a signal representative of one or more values, such as "next".

Other embodiments may employ a larger or different vocabulary for the test channel, e.g., "go up", "go down", "Value=X". For example, the "go up" or "go down" command might allow increment/decrement of a trim value allowing the test sequence to commence in the middle of a range rather than at an extreme of the trim value, possibly requiring fewer steps but potentially making the test sequence more complicated. Such vocabulary options may be encoded on the channel. Similarly, the command channel may have a more complex set of commands as well.

Figure 5:
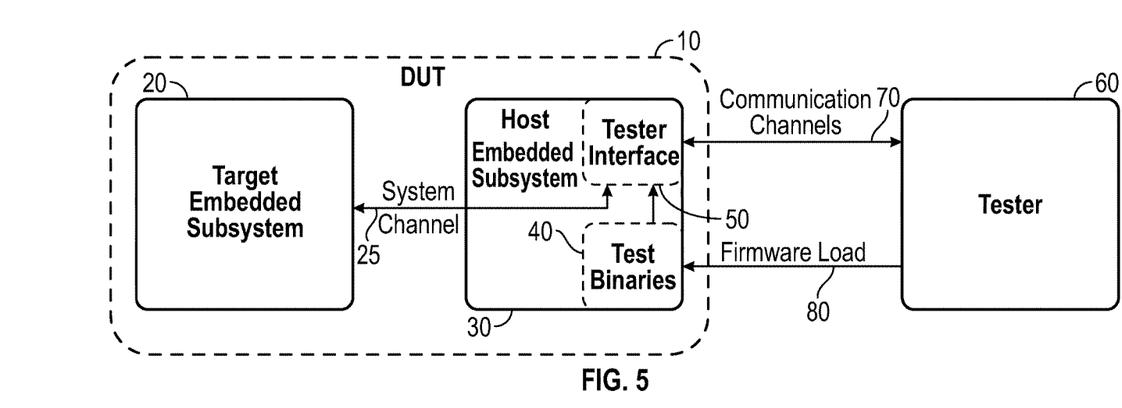
FIGS. 5 and 6 are block diagrams of systems capable of tuning a target embedded subsystem, in accordance with embodiments of the disclosure.

In certain embodiments, a system channel 25, as shown in FIG. 5, is implemented within the DUT between the host embedded subsystem and the target embedded subsystem. Over this system channel, the following occurs:
  a. Host embedded subsystem loads firmware into the target embedded subsystem as specified by the tester.
  b. Host embedded subsystem forwards signals to the target embedded subsystem that were received from the tester over the command channel or the test signaling channel.
  c. Host embedded subsystem receives signals from the target embedded subsystem that will be forwarded to the tester over the command channel or the test signaling channel.

As previously noted, the disclosure envisions alternate embodiments in which there may be a test channel or a command channel directly between the tester and the target embedded subsystem; there accordingly would not be a system channel in such embodiments.

From the foregoing example and reference to FIG. 6, it can be seen that a universal asynchronous receiver/transmitter (UART0) provides a bidirectional UART HCI transport for the command channel with the tester. General purpose input/output (GPIO) GPIO6 and GPIO7 provide the test signaling channel, where GPIO6 is the tester-to-DUT signal (via the Host embedded subsystem) and GPIO7 is the DUT-to-tester signal (also via the Host embedded subsystem). In addition, the command channel and the test signal channel could also rely on other transports available.

Therefore in accordance with a sample test implementation, the tuning system illustrated in FIGS. 5 and 6 generally performs the following operations:
1. A particular test-specific firmware is invoked by the tester 60 via the command channel 70.
2. Host 30 loads the selected test binary 40 to the target embedded subsystem 20 via tester interface 50 and system channel 25.
3. The target embedded subsystem 20 configures itself for tuning and/or measurement under control of the selected test binary 40.
4. The target embedded subsystem 20 signals via the system channel 25 that it is ready.
5. The tester 60 performs a measurement.
6. The tester 60 sends back to the target embedded subsystem 20 via the test signaling channel 80" the result of the measurement ("continue" or "stop", in this example).
7. The target embedded subsystem either advances its tuning control to the next value ("continue"), or stops at the current value ("stop") in response to the test signaling channel 80'.
8. If multiple tunings are performed in a single test, operations 3-6 are repeated for all tunings.
9. The target embedded subsystem returns all the final tuning values to the tester 60 via the command channel 70. This may occur following completion of all of the invoked one or more tests.

Referring now to FIGS. 7-11, these various sequences are illustrated. In the sequence diagram FIG. 7, overall interaction between the target and host embedded subsystems of the DUT and the tester are shown in the following example command sequence:
 a. The tester sends a Test_Load command for the desired test over the command channel to the host embedded subsystem.
 b. The host embedded subsystem immediately sends to the tester a HCI_Command_Status event over the command channel.
 c. The tester performs the Test Procedure for the desired test over the test signaling channel. Various example test procedures are set forth below.
 d. When the test is complete, a Test_Complete event will be generated containing the results over the command channel.

After the DUT host embedded subsystem receives the Test_Load command from the tester, the requested test binary is loaded to the target embedded subsystem via the system channel. Referring to the sequence diagram of FIG. 8, this comprises the following sequence:
 a. Host embedded subsystem transmits an HCI_Command_Status to the tester.
 b. Host embedded subsystem locates the firmware binary for the specified test.
 c. Host embedded subsystem loads firmware binary into the target embedded subsystem with the Test Binary Load Procedure.
 d. Host embedded subsystem executes the test with Test_Exec.
 e. The tester performs Test Procedure, which ends when host embedded subsystem receives a HCI_Command_Complete from the target embedded subsystem.
 f. Host embedded subsystem transmits a Test_Complete to the tester.

Figure 9:
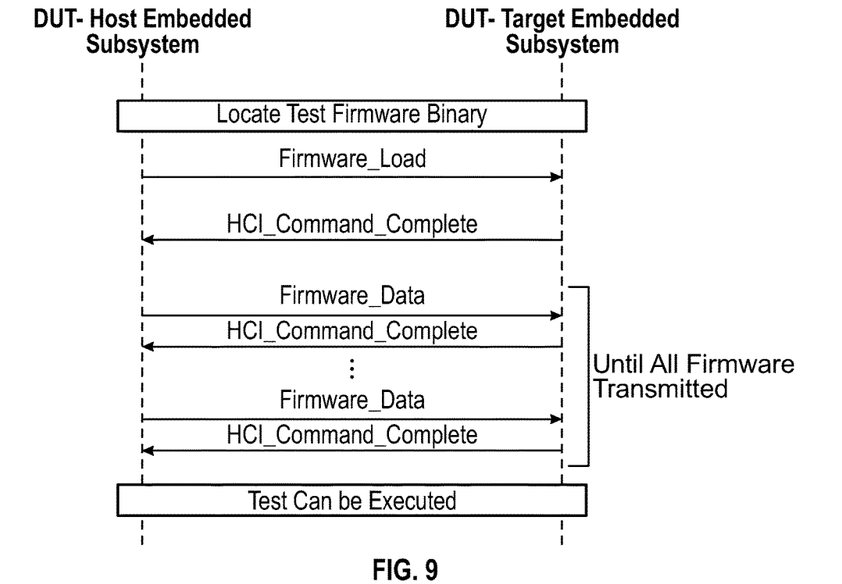

FIG. 9 illustrates the firmware loading procedure, in accordance with certain embodiments. The procedure begins with a Firmware_Load command transmitted to the target embedded subsystem that described the size and type of the firmware. The firmware data is iteratively loaded with a sequence of Firmware_Data commands until all firmware is transmitted from the host embedded subsystem to the target embedded subsystem, as shown. The HCI_Command_Complete from the final Firmware_Data will indicate the status of the entire operation (e.g., including CRC validation).

Figure 3:
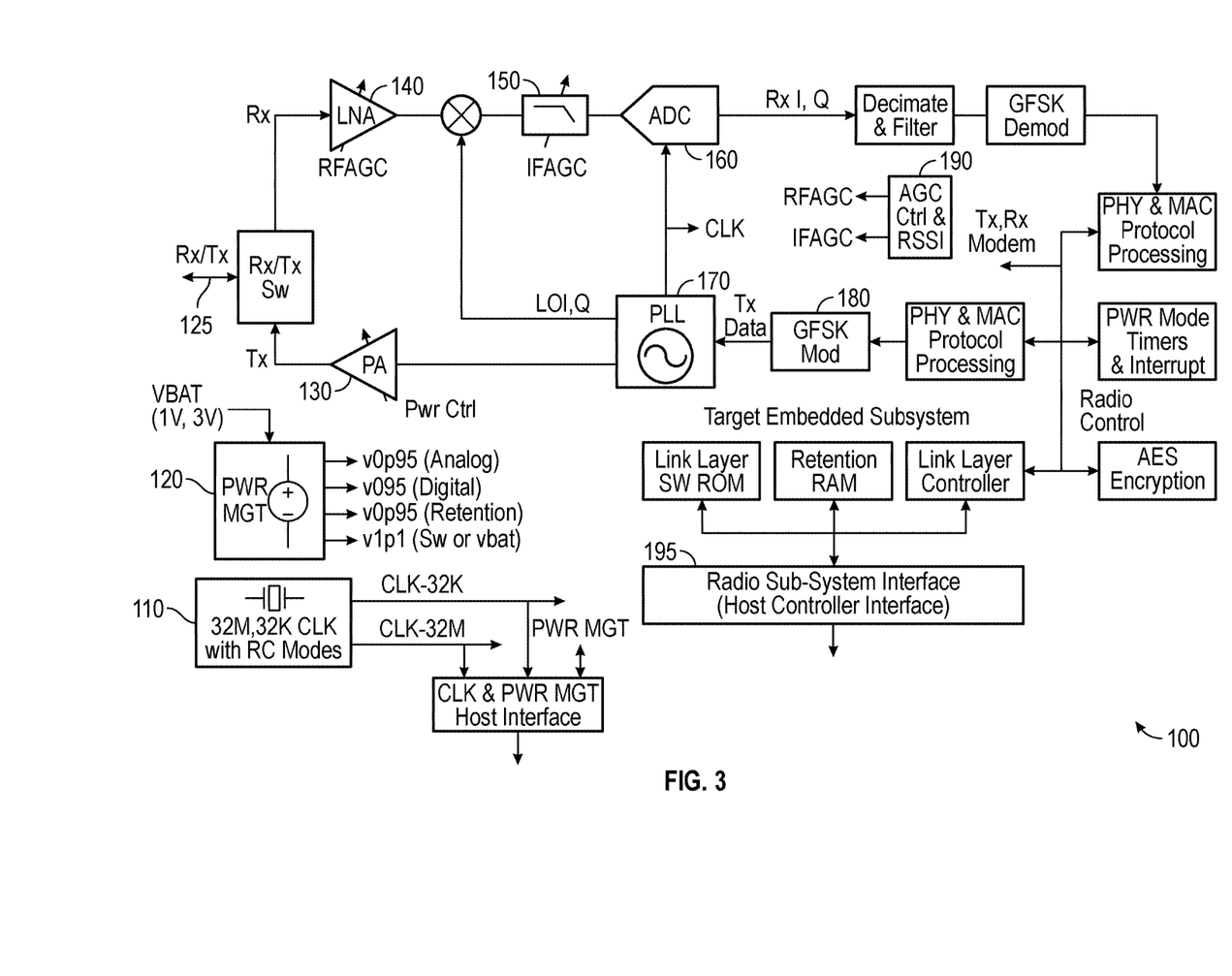
FIG. 3 is a block diagram and functional blocks of an example radio target embedded subsystem, in accordance with embodiments of the disclosure.
Figure 4:
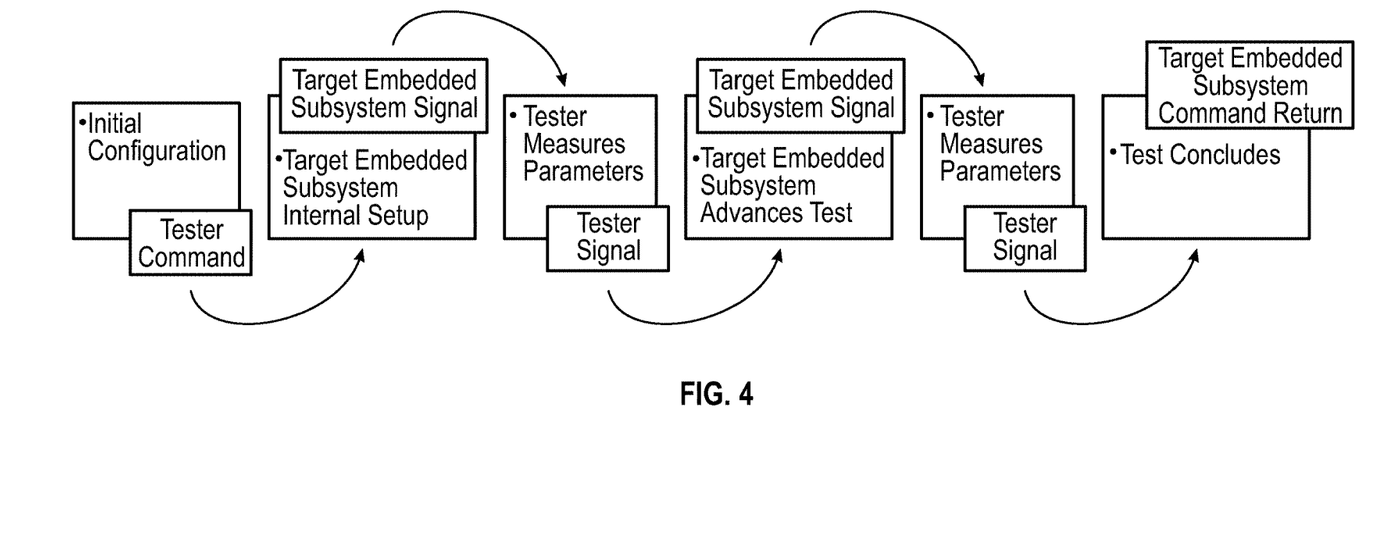
FIG. 4 illustrates a functional flow for testing of a target embedded subsystem, in accordance with embodiments of the disclosure.

The SoC may contain a Host Controller Interface (HCI) that carries communications between the host and target embedded subsystems of the DUT; please reference block 195 of FIG. 3. The HCI can carry at least two distinct types of communications, which will be referred to as "normal" HCI events and "raw" HCI events. Normal HCI events can carry a relatively large amount of data between the two embedded subsystems. Normal HCI event communications can contain framing, handling, error correction, and other overhead information that improves the utility and robustness of the communications but adds latency and delay to the communications. Raw HCI events carry a relatively small amount of data but are not burdened by lots of overhead, and therefore are characterized as having much lower latency than normal HCI events. Normal HCI events, then, can carry command packets with many parameters while raw HCI events can carry test flow signals with low latency, and facilitate faster testing. After the needed test firmware is loaded, the test procedure may commence. The DUT begins Test Procedure after the host embedded subsystem sends Test_Exec to the target embedded subsystem. During Test Procedure, host embedded subsystem waits for two types of transactions from the target embedded subsystem:
 a. HCI_Command_Complete (as a normal HCI event) indicating that the test has completed executing. This command contains the results of the test. The DUT will send Test_Complete to the tester over the command channel, including these results.
 b. A test action request (as a raw HCI event), usually requesting that the DUT communicate with the tester over the test signaling channel.

Figure 10:
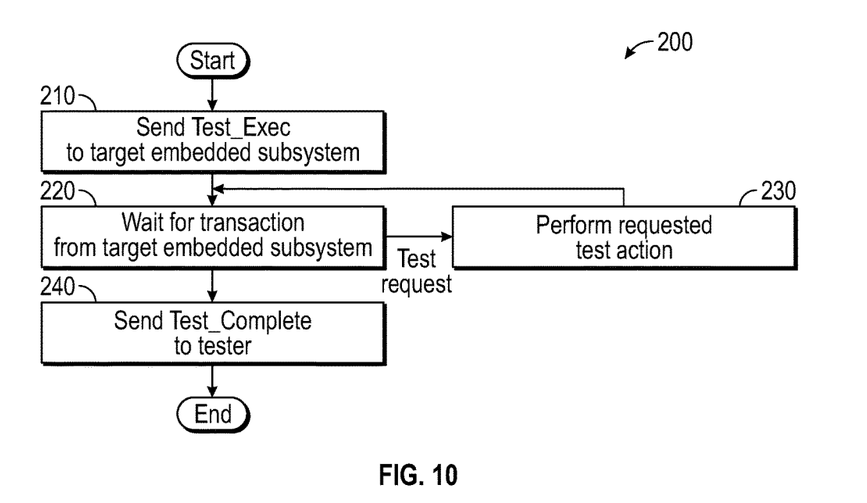
FIG. 10 is a flow chart that illustrates a test procedure, in accordance with embodiments of the disclosure.

This test procedure is illustrated in the flow chart 200 of FIG. 10. At block 210, the host embedded subsystem sends Test_Exec to the target embedded subsystem. At Blocks 220 and 230, the host embedded subsystem waits for an indication from the target that it is ready and then sends the desired test request to the target embedded subsystem, which performs the requested test action. The host sends the results of the test, Test_Complete, to the tester over the command channel at Block 240.

A requested test action begins with a request, such as a raw HCI event, from the target embedded subsystem and terminates with a response to the target embedded subsystem, also as a raw HCI event. Each request and response type is uniquely identified with a 1-byte ID, in accordance with certain embodiments. Any request or response may contain 1-3 bytes of payload, for example. Some example test actions are contained in Table 1 below:

TABLE 1

| Action | Direction | Description | Payload |
| --- | --- | --- | --- |
| TARGET_ECHO | target to host | target requests echo | Data to be echoed |
| HOST_ECHO | host to target | host echoes back data | Data from TARGET_ECHO |
| SIGNAL_WAIT_WHILE_ACK | target to host | target requests host signal tester "done" and wait while tester acknowledges host | None |
| SIGNAL_WAIT_WHILE_ACK_DONE | host to target | host response after SIGNAL_WAIT_WHILE_ACK complete | None |
| SIGNAL_BOOLEAN_ACK | target to host | target requests host signal tester "done" and detect "stop" or "continue" condition | None |
| SIGNAL_BOOLEAN_ACK_DONE | host to target | host response after SIGNAL_BOOLEAN_ACK complete | 0 if "stop" condition detected 1 if "continue" condition detected |
| TARGET_SLEEP_REQ | target to host | target requests host prepare for power-gated deep sleep | None |
| HOST_SLEEP_RSP | host to target | host response after TARGET_SLEEP_REQ complete | None |

Figure 11:
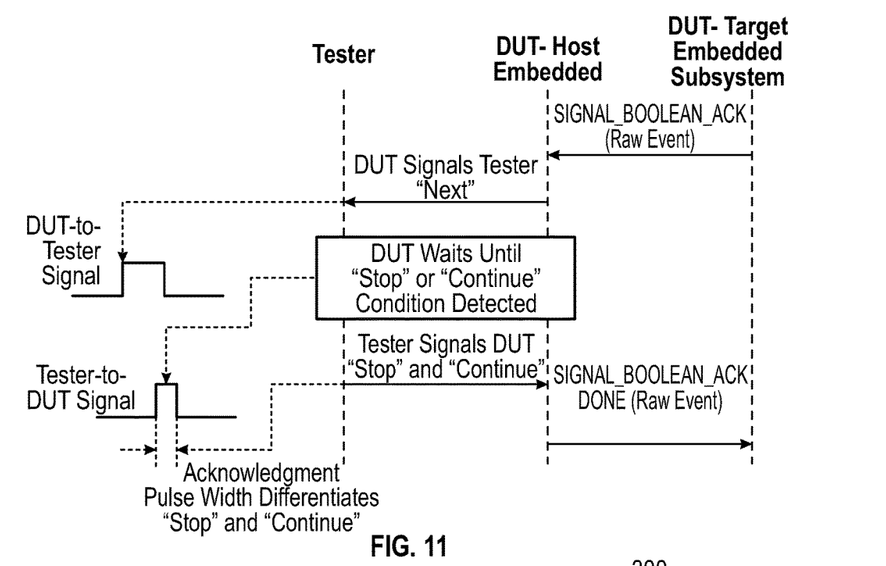
FIG. 11 illustrates an example timing diagram, in accordance with embodiments of the disclosure.

An example timing diagram for SIGNAL_BOOLEAN_ACK is shown in FIG. 11.

Referring now to the Test Procedure noted with regard to FIGS. 7-11, there are many test groups that may be employed in the testing and tuning of a target embedded subsystem. Table 2, below, shows some example test groups that may be used to test and trim a radio target embedded subsystem, for example.

TABLE 2

| Test Group Name | Measurements | Invocation |
| --- | --- | --- |
| Reset 3 V | Voltages, Currents, Data | Power and pins |
| Scan (ATPG) | Digital Compare | Test Pattern |
| BIST | Digital Compare | Test Pattern |
| PMU Trim | Voltages, Currents | Command |
| Clock Test | Data, Time Constants | Command |
| VCO Trim | Frequency | Command |
| Rx Trim | Autonomous On-chip | Command |
| Tx Trim 3 V | RF Power | Command |
| Voltages | Voltages | Command |
| Block Currents | Currents | Command |
| Sleep 3 V | Voltages, Currents, Data | Command |
| Reset 1 V | Voltages, Currents, Data | Power and pins |
| Tx Trim 1 V | RF Power, Currents | Command |
| Sleep 1 V | Voltages, Currents | Command |
| Store Trim Values in NVM | | TBD |

As noted in Table 2, trim values may be stored in nonvolatile memory (NVM). In many instances, later tests rely on using earlier determined trim values that may preferably remain in target embedded subsystem registers. In these cases, the target embedded subsystem would not be reset between tests, except after the scan/BIST tests and when changing voltages from 3V to 1V. Further, the ordering of tests in such circumstances may be of note.

By way of example, reference is made to example test types in order to further illustrate embodiments described herein. From these example test types, the interaction between the target embedded subsystem and the tester, via the host embedded subsystem, shown in blocks 220 and 230 of FIG. 10, is further illustrated.

To trim a power management unit (PMU), such as that illustrated in block 120 in the block diagram of FIG. 3, PMU trim module test firmware is invoked via a command from the tester, which returns four trim values for the power management block of the radio target embedded subsystem. The host embedded subsystem sends a test command Test_Exec to the target embedded subsystem and in return the target embedded subsystem sends SIGNAL_WAIT_WHILE_ACK. When ready the tester responds with SIGNAL_WAIT_WHILE_ACK_DONE. The target embedded subsystem applies a trim value and sends SIGNAL_BOOLEAN_ACK. The tester measures the performance parameter at a test point of interest and sends to the host embedded subsystem either SIGNAL_BOOLEAN_ACK_DONE= "continue" if the target value has not been reached or SIGNAL_BOOLEAN_ACK_DONE="stop" if the target value has been met. The target embedded subsystem proceeds to the next trim value (if "continue") or to the next stage of trim needed for the PMU block (if "stop"). This is repeated for all of the trim parameters. Trim parameters for the PMU block may include trimming of a voltage reference and a current reference, for example. When all stages of PMU trim are complete, the target embedded subsystem will send an HCI_Command_Complete with the trim values via the command channel interface. In certain embodiments, the host embedded subsystem forwards the trim values to the tester with Test_Complete.

Another example concerns tuning the receiver of the radio, including the clocks 110, low-noise amplifier (LNA) 140, intermediate frequency automatic gain control (IF-AGC) 150, and the analog to digital converter (ADC) 160 shown in FIG. 3. Using the tuning methodology set forth herein, the host embedded subsystem sends TEST_Exec with test parameters, such as target frequency and/or channel number, for an Rx Trim test and the target configures and sends SIGNAL_WAIT_WHILE_ACK. The tester provides on-channel RF signals at the RF port 125 (generally corresponding to the RF Impedance Match block shown in FIG. 2) and sends SIGNAL_WAIT_WHILE_ACK_DONE via the host to the target embedded subsystem. The target embedded subsystem performs internal calibrations and measurements of the receiver, including, for example: tuning an internal LC filter for maximum gain; checking the relative gain of automatic gain control (AGC) settings; checking that the channel frequency offset is within tolerance; measuring and correcting intrinsic DC offsets in the receiver path; calibrating internal channel phase and amplitude; and trimming for optimal FM deviation. The target embedded subsystem next sends SIGNAL_WAIT_WHILE_ACK. The tester sends SIGNAL_WAIT_WHILE_ACK_DONE, and can disable the RF signal. Finally, the target sends HCI_Command_Complete with parameters. The trim values used to tune the receiver can be stored in local nonvolatile memory. The transmitter and any other blocks of the radio can also be tuned and trim settings stored. In certain embodiments, the host embedded subsystem forwards the trim values to the tester with Test_Complete.

As previously noted, trim values from a variety of tests can be written to local memory, such as nonvolatile memory. Table 3 below describes example trim parameters that can be stored for tuning of individual blocks or functions of the radio target embedded subsystem. The table accordingly has references to various functional blocks shown in FIG. 3.

TABLE 3

| Test Result Name | Description |
| --- | --- |
| REFERENCE VOLTAGE TRIM | Trims the active state voltage reference; refer to power management block 120 of FIG. 3<br>This trim removes process and mismatch variation in generation of reference voltages for all blocks in active state.<br>Incorrect trim can negatively affect transceiver performance and in extreme cases can affect chip functionality. |
| REFERENCE CURRENT TRIM | Trims the reference current source that provides a current reference to TXVCR blocks; refer to power management block 120 of FIG. 3<br>This trim removes process variation in generation of reference currents and has impact on analog block power consumption.<br>Incorrect trim can negatively affect transceiver performance and in extreme cases can affect chip functionality. |
| LNA TRIM | Trims the receiver LNA peak frequency to the center of the band; refer to LNA 140 of FIG. 3<br>Proper trim centers the frequency selectivity and maximizes receiver gain.<br>Incorrect trim can impact receiver gain and ultimately degrade sensitivity. |
| CHANNEL PHASE AND AMPLITUDE TRIM | Calculates the digital correction to calibrate channel phase and amplitude of the receiver to trim IFAGC 150 of FIG. 3<br>Proper trim maximizes the receiver immunity to interference.<br>Incorrect trim can degrade such performance and even affect receiver functionality. |
| DC OFFSET TRIM | Calculates the digital correction to remove DC offsets present in the receiver to trim ADC (analog to digital converter) 160 of FIG. 3<br>Proper trim maximizes the receiver dynamic range and maximizes receiver performance in presence of interference.<br>Incorrect trim can degrade such performance and even affect receiver functionality. |
| RSSI TRIM | Calculates the digital correction that corrects gain error for correct RSSI level reporting, to trim AGC Ctrl and RSSI (received signal strength indicator) 190 of FIG. 3<br>Proper trim yields correct room temperature RSSI reporting independent of gain errors due to expected silicon or board component variations.<br>Incorrect trim will yield erroneous RSSI reporting. |
| MOD TRIM | Trims the transmitter frequency deviation; PLL (phase-locked loop) 170 and GFSK (Gaussian frequency shift keying) Mod 180 of FIG. 3<br>Proper trim adjusts the frequency deviation for enhanced performance.<br>Incorrect trim can impact specification compliance to transmitter frequency characteristics. |
| TXC TUNE TRIM | Trims the transmitter PA (power amplifier) 130 on-chip LC filter frequency peak to the center of the band<br>Proper trim centers the transmitter on-chip LC filter frequency for enhanced performance.<br>Incorrect trim can impact transmitter output power and efficiency. |
| TX DRIVE TRIM | Trims the transmitter power amplifier (PA 130) drive level<br>Proper trim provides sufficient drive for the power amplifier to achieve target RF output power.<br>Incorrect trim can affect transmitter output power and/or efficiency.<br>This trim has direct effect on transmitter RF output power and total power consumption in transmit mode. |

Figure 12:
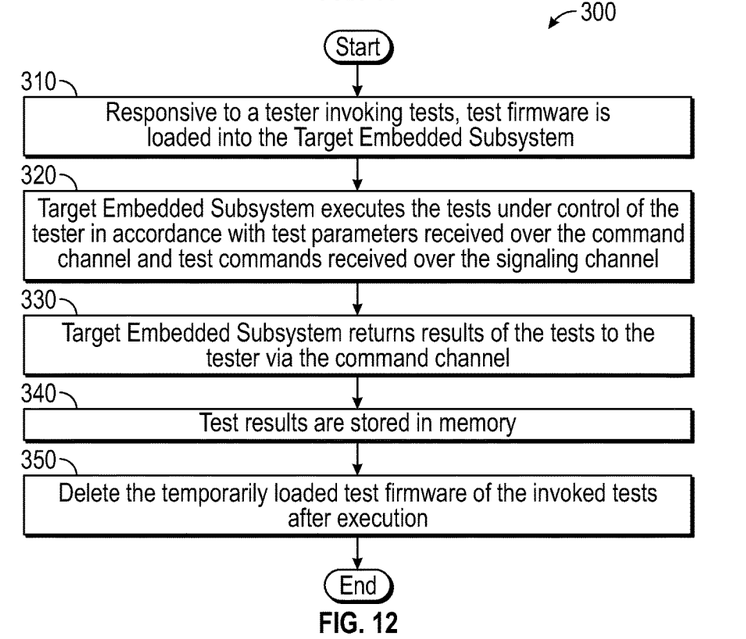
FIG. 12 is a flow chart that illustrates tuning of a target embedded subsystem, in accordance with embodiments of the disclosure.

In light of the foregoing, reference is made to an overall methodology for testing embedded subsystems. Referring now to flow 300 of FIG. 12, at block 310, responsive to a tester invoking a test, test firmware is loaded into the controller of a target embedded subsystem; as previously stated, this may be accomplished at test time and may be facilitated by the host embedded subsystem in direct communication with the tester. The target embedded subsystem executes the test(s) under control of the tester in accordance with test parameters received over the command channel and test commands received over the signaling channel at block 320. At block 330, the target embedded subsystem returns results of the tests to the tester via the command channel. Test (trim) results can be optionally stored in memory at block 340. Following execution of the tests, the temporarily loaded test firmware can be deleted at block 350 to recover memory space in the target embedded subsystem. Additionally, test firmware that implements various communication channels to and from the tester is not needed after test and can be deleted. Alternate embodiments do not delete the test firmware, which can be a permanent part of the target and/or host embedded subsystem(s).

Therefore, in accordance with the disclosure, there is a system capable of tuning of embedded subsystems in which a host embedded subsystem of a DUT acts as an intermediary between a tester external to the DUT and a target embedded subsystem of the DUT to be tested and tuned. In this system, the host embedded subsystem and the target embedded subsystem communicate over a host controller interface and the target embedded subsystem has a controller. The tester external to the DUT communicates with the target embedded subsystem via the host embedded subsystem over a command channel to initiate test procedures for testing the target embedded subsystem and to return test results of the test procedures and where the tester and the target embedded subsystem communicate via the host embedded subsystem over a test signaling channel to advance and control invoked test procedures. Responsive to a command by the tester over the command channel to invoke one or more tests of the test procedures, test firmware of the invoked tests is loaded onto the target embedded subsystem via the host controller interface and executed by the controller of the target embedded subsystem under control of the tester over the command and test signaling channels. Test results of the invoked one or more tests are returned by the target embedded subsystem to the tester via the host embedded subsystem over the command channel, and the returned test results are stored. The temporarily loaded test firmware may be deleted from the target and also, optionally, the host target subsystems to reclaim valuable memory space.

In accordance with alternate embodiments, there is provided a system capable of tuning a target embedded subsystem of a DUT in which the target embedded subsystem and the tester external to the DUT are in communication, possibly without the intercession of a host embedded subsystem of the DUT. In such as a system, responsive to a command by the tester over a command channel to invoke one or more tests of test procedures for testing the target embedded subsystem, test firmware of the invoked tests is loaded onto the target embedded subsystem and executed by the controller of the target embedded subsystem under control of the tester over the test signaling channel. Test results of the invoked one or more tests are returned by the target embedded subsystem to the tester over the command channel and the returned test results are stored. Temporarily loaded test firmware is deleted from the target embedded subsystem following execution of the invoked one or more tests by the controller of the target embedded subsystem.

Further, in accordance with the disclosure, a method for testing embedded subsystems is provided in which: responsive to a tester invoking one or more tests of a plurality of test procedures via a command channel between the tester and a target embedded subsystem of a device under test (DUT), loading test firmware of the invoked one or more tests into the target embedded subsystem, the test firmware of the invoked one or more tests operable to execute the one or more tests; the target embedded subsystem executing the one or more tests under control of the tester in accordance with test parameters received from the tester over the command channel and in accordance with test commands received from the tester over a test signaling channel; the target embedded subsystem returning results of the one or more tests to the tester via the command channel; and storing the results of the one or more tests in memory.

Non-analog portions of the integrated circuits disclosed above may be partially defined by a set of instructions of a Hardware Description Language (HDL). The instructions may be stored in a non-transient computer readable medium. The instructions may be distributed via the computer readable medium or via other means such as a wired or wireless network. The instructions may be used to control manufacture or design of the integrated circuit, and may be combined with other instructions.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

It will be appreciated that the devices, systems, and methods described above are set forth by way of example and not of limitation. Absent an explicit indication to the contrary, the disclosed steps may be modified, supplemented, omitted, and/or re-ordered without departing from the scope of this disclosure. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context.

The method steps of the implementations described herein are intended to include any suitable method of causing such method steps to be performed, consistent with the patentability of the following claims, unless a different meaning is expressly provided or otherwise clear from the context. So for example performing X includes any suitable method for causing another party such as a remote user, a remote processing resource (e.g., a server or cloud computer) or a machine to perform X. Similarly, performing elements X, Y, and Z may include any method of directing or controlling any combination of such other individuals or resources to perform element X, Y, and Z to obtain the benefit of such steps. Thus method steps of the implementations described herein are intended to include any suitable method of causing one or more other parties or entities to perform the steps, consistent with the patentability of the following claims, unless a different meaning is expressly provided or otherwise clear from the context. Such parties or entities need not be under the direction or control of any other party or entity, and need not be located within a particular jurisdiction.

It should further be appreciated that the methods above are provided by way of example. Absent an explicit indication to the contrary, the disclosed steps may be modified, supplemented, omitted, and/or re-ordered without departing from the scope of this disclosure.

It will be appreciated that the methods and systems described above are set forth by way of example and not of limitation. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context. Thus, while particular embodiments have been shown and described, it will be apparent to those skilled in the art that various changes and modifications in form and details may be made therein without departing from the scope of this disclosure and are intended to form a part of the disclosure as defined by the following claims, which are to be interpreted in the broadest sense allowable by law.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. A tuning system, comprising:
    a device under test having:
        a host embedded subsystem;
        a target embedded subsystem to be tested, where the host embedded subsystem and the target embedded subsystem communicate over a host controller interface and where the target embedded subsystem has a controller; and
        a tester external to the device under test and in communication with the target embedded subsystem via the host embedded subsystem over a command channel to initiate test procedures for testing the target embedded subsystem and to return test results of the test procedures and where the tester and the target embedded subsystem communicate via the host embedded subsystem over a test signaling channel to advance and control invoked test procedures,
    where responsive to a command by the tester over the command channel to invoke one or more tests of the test procedures, test firmware of the invoked one or more tests is loaded onto the target embedded subsystem via the host controller interface and executed by the controller of the target embedded subsystem under control of the tester over the command and test signaling channels, test results of the invoked one or more tests are returned by the target embedded subsystem to the tester via the host embedded subsystem over the command channel.

2. The system of claim 1, where the test firmware of the invoked one or more tests controls operation of the command channel and the test signaling channel during execution of the invoked one or more tests.

3. The system of claim 1, where following execution of the invoked one or more tests by the controller of the target embedded subsystem, the test results are returned to the tester by the target embedded subsystem over the command channel.

4. The system of claim 1, where following execution of the invoked one or more tests the test firmware is deleted from the target embedded subsystem to recover memory space of the target embedded subsystem.

5. The system of claim 1, where the tester stores the returned test results in nonvolatile memory of the tester, the target embedded subsystem stores one or more values of the test results in local nonvolatile memory of the target embedded subsystem, or the host embedded subsystem stores one or more values of the test results in local nonvolatile memory of the host embedded subsystem.

6. The system of claim 1, where the test firmware of the test procedures is stored in the host embedded subsystem and responsive to the command by the tester to invoke the one or more tests, the host embedded subsystem retrieves the test firmware of the invoked one or more tests and loads the test firmware of the invoked one or more tests onto the target embedded subsystem via the host controller interface.

7. The system of claim 6, where the test firmware of the test procedures is loaded into the host embedded subsystem during one or more of a host scan and a built-in-self test of the host embedded subsystem.

8. The system of claim 6, where the test firmware stored in the host embedded subsystem comprises test commands that define a first interface between the host embedded subsystem and the tester, and a second interface between the host embedded subsystem and the target embedded subsystem.

9. The system of claim 6, where responsive to the command by the tester to invoke the one or more tests the test firmware of the invoked one or more tests is loaded into local memory of a microcontroller of the target embedded subsystem by the host embedded subsystem via the host controller interface.

10. The system of claim 6, where the host controller interface is a system channel and the host embedded subsystem transmits to the target embedded subsystem via the system channel a firmware load command that describes the size and type of the test firmware of the invoked one or more tests and then iteratively loads firmware data of the test firmware onto the microcontroller of the target embedded subsystem with one or more firmware data commands.

11. The system of claim 6, where the test firmware of the invoked one or more tests is stored in the host embedded subsystem and following execution of the invoked one or more tests, the test firmware of the invoked one or more tests is deleted from both the target embedded subsystem and the host embedded subsystem.

12. A tuning system, comprising:
    a device under test having:
        a host embedded subsystem;
        a target embedded subsystem to be tested, in communication with the host embedded subsystem and having a controller; and
    a tester external to the device under test and coupled to at least the target embedded subsystem,
    where responsive to a command by the tester over a command channel to invoke one or more tests of test procedures for testing the target embedded subsystem, test firmware of the invoked one or more tests is loaded onto the target embedded subsystem and executed by the controller of the target embedded subsystem under control of the tester over the test signaling channel, test results of the invoked one or more tests are returned by the target embedded subsystem to the tester over the command channel, and the loaded test firmware is deleted from the target embedded subsystem following execution of the invoked one or more tests by the controller of the target embedded subsystem, and
    where the tester and the target embedded subsystem communicate over a bidirectional command channel to initiate test procedures for testing the target embedded subsystem and to return test results of the test procedures and where the tester and the target embedded subsystem communicate over a bidirectional test signaling channel to advance and control invoked test procedures.

13. The system of claim 12, where the test firmware of the invoked one or more tests controls operation of the command channel and the test signaling channel during execution of the invoked one or more tests.

14. The system of claim 12, where the tester stores the returned test results in nonvolatile memory of the tester, the target embedded subsystem stores one or more values of the test results in local nonvolatile memory of the target embedded subsystem, or the host embedded subsystem stores one or more values of the test results in local nonvolatile memory of the host embedded subsystem.

15. A method for testing embedded subsystems, comprising:
responsive to a tester invoking one or more tests of a plurality of test procedures via a command channel between the tester and a target embedded subsystem of a device under test (DUT), loading test firmware of the invoked one or more tests into the target embedded subsystem, the test firmware of the invoked one or more tests operable to execute the one or more tests;
the target embedded subsystem executing the one or more tests under control of the tester in accordance with test parameters received from the tester over the command channel and in accordance with test commands received from the tester over a test signaling channel; and
the target embedded subsystem returning results of the one or more tests to the tester via the command channel,
where the tester and the target embedded subsystem communicate to advance and control the invoked one or more tests.

16. The method of claim 15, further comprising the tester invoking the one or more tests over the command channel via a host embedded subsystem coupled to the target embedded subsystem, the host embedded subsystem temporarily loading the invoked one or more tests into the target embedded subsystem responsive to a command by the tester over the command channel, and the target embedded subsystem returning results of the one or more tests to the tester over the command channel via the host embedded subsystem.

17. The method of claim 16, where test firmware of the test procedures is stored in the host embedded subsystem and responsive to receiving the command by the tester to invoke the one or more tests, the host embedded subsystem retrieving the test firmware of the invoked one or more tests and loading the test firmware of the invoked one or more tests onto the target embedded subsystem via a host controller interface between the host embedded subsystem and the target embedded subsystem.

18. The method of claim 16, further comprising loading the test firmware of the test procedures into the host embedded subsystem during one or more of a host scan and a built-in-self test of the host embedded subsystem, where the test firmware stored in the host embedded subsystem comprises test commands that define a first interface between the host embedded subsystem and the tester, and a second interface between the host embedded subsystem and the target embedded subsystem.

19. The method of claim 16, where responsive to receiving the command by the tester to invoke the one or more tests loading the test firmware of the invoked one or more tests into local memory of a microcontroller of the target embedded subsystem by the host embedded subsystem via a host controller interface between the host embedded subsystem and the target embedded subsystem.

20. The method of claim 16, where the host controller interface is a system channel and further comprising the host embedded subsystem transmitting to the target embedded subsystem via the system channel a firmware load command that describes the size and type of the test firmware of the invoked one or more tests and then iteratively loading firmware data of the test firmware onto the microcontroller of the target embedded subsystem with one or more firmware data commands.

21. The method of claim 16, where the test firmware of the invoked one or more tests is stored in the host embedded subsystem and following execution of the invoked one or more tests, deleting the test firmware of the invoked one or more tests from both the target embedded subsystem and the host embedded subsystem.

22. The method of claim 15, further comprising trimming one or more structures of the target embedded subsystem using the results of the one or more tests.

23. The method of claim 15, the target embedded subsystem returning results of the one or more tests to the tester following completion of the invoked one or more tests, and further comprising storing the results of the one or more tests in one or more of nonvolatile memory of the tester, local nonvolatile memory of the host embedded subsystem, and local nonvolatile memory of the target embedded subsystem.

24. The method of claim 15, following execution of the invoked one or more tests further comprising deleting the test firmware of the invoked one or more tests from one or more of the target embedded subsystem and the host embedded subsystem.

* * * * *